(12) United States Patent
Shi et al.

(10) Patent No.: US 11,508,943 B2
(45) Date of Patent: Nov. 22, 2022

(54) PIXEL CIRCUIT, DISPLAY PANEL, AND TEMPERATURE COMPENSATION METHOD FOR DISPLAY PANEL

(71) Applicant: BOE Technology Group Co., Ltd., Beijing (CN)

(72) Inventors: Yongming Shi, Beijing (CN); Liye Duan, Beijing (CN); Chun Wang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 159 days.

(21) Appl. No.: 16/605,414

(22) PCT Filed: Apr. 18, 2019

(86) PCT No.: PCT/CN2019/083207
§ 371 (c)(1),
(2) Date: Oct. 15, 2019

(87) PCT Pub. No.: WO2019/214414
PCT Pub. Date: Nov. 14, 2019

(65) Prior Publication Data
US 2020/0235328 A1 Jul. 23, 2020

(30) Foreign Application Priority Data
May 9, 2018 (CN) .......................... 201810439230.6

(51) Int. Cl.
*H01L 51/52* (2006.01)
*H01L 27/32* (2006.01)
(Continued)

(52) U.S. Cl.
CPC ........ *H01L 51/529* (2013.01); *H01L 27/3225* (2013.01); *H01L 27/3244* (2013.01); *H01L 35/08* (2013.01); *H01L 35/32* (2013.01)

(58) Field of Classification Search
CPC . H01L 27/3225; H01L 27/3244; H01L 35/32; H01L 51/529; H01L 35/08; G09G 3/3208; G09F 9/33
See application file for complete search history.

(56) References Cited

U.S. PATENT DOCUMENTS 6,507,328 B1 1/2003 Lee
7,663,054 B2 2/2010 Shutoh et al.
(Continued)

FOREIGN PATENT DOCUMENTS

CN 1624947 A 6/2005
CN 101044638 A 9/2007
(Continued)

OTHER PUBLICATIONS

First Office Action, including Search Report, for Chinese Patent Application No. 201810439230.6, dated Apr. 28, 2019, 21 pages.

*Primary Examiner* — Thanh T Nguyen
(74) *Attorney, Agent, or Firm* — Westman, Champlin & Koehler, P.A.

(57) ABSTRACT

The present application provides a pixel circuit, a display panel, and a temperature compensation method for a display panel. The display panel includes a plurality of pixel units. At least one of the plurality of pixel units includes: a display layer comprising a light emitting element; and a thermoelectric conversion layer comprising a thermoelectric element having a first terminal and a second terminal, wherein the first terminal is disposed adjacent to the light emitting element and in thermal contact with the light emitting element, and the second terminal is disposed away from the light emitting element. The thermoelectric element has a first
(Continued)

Figure 1A:
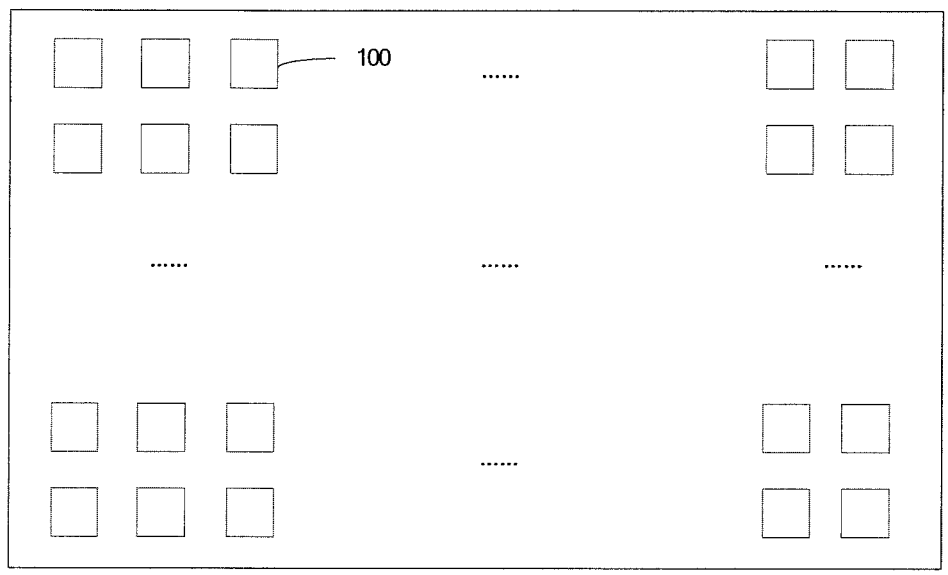

signal terminal and a second signal terminal, and is configured to generate a temperature difference voltage signal between the first signal terminal and the second signal terminal according to a temperature difference between the first terminal and the second terminal.

16 Claims, 3 Drawing Sheets

(51) Int. Cl.
*H01L 35/08* (2006.01)
*H01L 35/32* (2006.01)

(56) References Cited

U.S. PATENT DOCUMENTS

| | | | |
|---|---|---|---|
| 9,294,702 | B2 | 3/2016 | Lee et al. |
| 9,960,761 | B2 | 5/2018 | Cao |
| 2005/0139251 | A1 | 6/2005 | Shutoh et al. |
| 2007/0187815 | A1* | 8/2007 | Dai ............... H01L 35/34 257/723 |
| 2009/0007952 | A1 | 1/2009 | Kondoh et al. |
| 2012/0280631 | A1 | 11/2012 | Burrows et al. |
| 2014/0070190 | A1* | 3/2014 | Chen ............. H01L 35/325 257/40 |
| 2014/0151530 | A1 | 6/2014 | Lee et al. |
| 2017/0302264 | A1 | 10/2017 | Cao |
| 2018/0158418 | A1* | 6/2018 | Ryu ............... G09G 3/3225 |
| 2018/0293933 | A1* | 10/2018 | Choi ............... H01L 35/32 |

FOREIGN PATENT DOCUMENTS

| | | |
|---|---|---|
| CN | 202651212 U | 1/2013 |
| CN | 103515522 A | 1/2014 |
| CN | 103855110 A | 6/2014 |
| CN | 104599640 A | 5/2015 |
| CN | 105390112 A | 3/2016 |
| CN | 105762172 A | 7/2016 |
| CN | 108648635 A | 10/2018 |

\* cited by examiner

PIXEL CIRCUIT, DISPLAY PANEL, AND TEMPERATURE COMPENSATION METHOD FOR DISPLAY PANEL

CROSS-REFERENCE TO RELATED APPLICATION(S)

This application corresponds to PCT application PCT/CN2019/083207, filed on 18 Apr. 2019, which claims priority to the Chinese Patent Application No. 201810439230.6, filed on May 9, 2018, the contents of which are incorporated herein by reference in their entireties.

TECHNICAL FIELD

The present disclosure relates to the field of display technologies, and more particularly, to a pixel circuit, a display panel, and a temperature compensation method for a display panel.

BACKGROUND

Organic Light Emitting Diode displays (OLEDs) have been widely used. An OLED comprises an anode, a cathode, and an organic light emitting layer provided between the anode and the cathode. When holes injected from the anode and electrons injected from the cathode are recombined in the organic light emitting layer, the organic light emitting layer emits light.

Quantum dot Light Emitting Diode displays (QLEDs) have a structure similar to that of the OLEDs, primarily except that in the QLEDs, light is emitted through an quantum dot layer.

Both the OLEDs and the QLEDs are current-driven display apparatuses. Therefore, after operation for a period of time, due to the thermal effect of current, respective pixels of the display apparatus may have different temperatures, which results in temperature unevenness. The temperatures affect operating curves of thin film transistors in the pixels, and thus, the phenomenon of temperature unevenness may affect the display quality of the display apparatus.

SUMMARY

Embodiments of the present disclosure relate to a pixel circuit, a display panel, and a temperature compensation method for a display panel.

According to a first aspect of the present disclosure, there is provided a display panel. The display panel comprises a plurality of pixel units. At least one of the plurality of pixel units comprises: a display layer comprising a light emitting element; and a thermoelectric conversion layer comprising a thermoelectric element having a first terminal and a second terminal, wherein the first terminal is disposed adjacent to the light emitting element and in thermal contact with the light emitting element, and the second terminal is disposed away from the light emitting element. The thermoelectric element has a first signal terminal and a second signal terminal, and the thermoelectric element is configured to generate a temperature difference voltage signal between the first signal terminal and the second signal terminal according to a temperature difference between the first terminal and the second terminal.

According to an embodiment of the present disclosure, the thermoelectric element is further configured to receive a temperature compensation signal through the first signal terminal to perform temperature compensation on the light emitting element through thermal contact between the first terminal of the thermoelectric element and the light emitting element.

According to an embodiment of the present disclosure, the thermoelectric element may comprise: a first semiconductor layer having a first conductivity type; a second semiconductor layer having a second conductivity type different from the first conductivity type, wherein the second semiconductor layer is disposed separately from the first semiconductor layer; a coupling electrode provided at the first terminal of the thermoelectric element and electrically coupling the first semiconductor layer and the second semiconductor layer; a first electrode provided at the second terminal of the thermoelectric element and electrically coupled to the first semiconductor layer; and a second electrode provided at the second terminal of the thermoelectric element and electrically coupled to the second semiconductor layer. The first signal terminal is disposed on the first electrode, and the second signal terminal is disposed on the second electrode.

According to an embodiment of the present disclosure, the second electrode is a common electrode.

According to an embodiment of the present disclosure, the coupling electrode of the thermoelectric element is one electrode of the light emitting element.

According to an embodiment of the present disclosure, the display panel may further comprise: a heat equalizing element disposed at the second terminal of the thermoelectric element, so that second terminals of thermoelectric elements in the at least one pixel unit have consistent temperature.

According to an embodiment of the present disclosure, the display panel may further comprise: a driving circuit layer electrically coupled to the light emitting element and the thermoelectric element, wherein the thermoelectric conversion layer is provided between the display layer and the driving circuit layer.

According to an embodiment of the present disclosure, the driving circuit layer may comprise: a temperature difference reading sub-circuit electrically coupled to the first signal terminal of the thermoelectric element and configured to read the temperature difference voltage signal from the first signal terminal of the thermoelectric element; and a temperature compensation sub-circuit electrically coupled to the first signal terminal of the thermoelectric element and configured to input the temperature compensation signal to the first signal terminal of the thermoelectric element.

According to an embodiment of the present disclosure, the temperature compensation signal is determined based on the temperature difference voltage signal.

According to an embodiment of the present disclosure, the temperature compensation signal is determined based on a difference between the temperature difference voltage signal and an average value of respective temperature difference voltage signals which are read in the at least one pixel unit.

According to a second aspect of the present disclosure, there is provided a pixel circuit. The pixel circuit comprises: a light emitting element; a driving sub-circuit electrically coupled to a first voltage terminal and a first terminal of the light emitting element and configured to generate driving current for driving the light emitting element to emit light based on a first voltage from the first voltage terminal; a thermoelectric element having a first signal terminal and a second signal terminal, wherein the second signal terminal is electrically coupled to the second voltage terminal; a temperature difference reading sub-circuit electrically coupled to a first control signal terminal, a read signal terminal, and the first signal terminal of the thermoelectric element, and configured to read a temperature difference voltage signal at the first signal terminal of the thermoelectric element to the read signal terminal under control of a first control signal from the first control signal terminal; and a temperature compensation sub-circuit electrically coupled to a second control signal terminal, a compensation signal terminal, and the first signal terminal of the thermoelectric element, and configured to transmit a temperature compensation signal from the compensation signal terminal to the first signal terminal of the thermoelectric element under control of a second control signal from the second control signal terminal.

According to an embodiment of the present disclosure, the temperature difference reading sub-circuit comprises a first transistor. The first transistor has a control terminal electrically coupled to the first control signal terminal, a first terminal electrically coupled to the first signal terminal of the thermoelectric element, and a second terminal electrically coupled to the read signal terminal.

According to an embodiment of the present disclosure, the temperature compensation sub-circuit comprises a second transistor, a third transistor, and a compensation capacitor. The second transistor has a control terminal electrically coupled to the second control signal terminal, a first terminal electrically coupled to the compensation signal terminal, and a second terminal electrically coupled to a control terminal of the third transistor, the third transistor has a first terminal electrically coupled to the first voltage terminal, and a second terminal electrically coupled to the first signal terminal of the thermoelectric element, and the compensation capacitor has a first terminal electrically coupled to the control terminal of the third transistor, and a second terminal electrically coupled to the first voltage terminal.

According to a third aspect of the present disclosure, there is provided a method for performing temperature compensation on the display panel described above. The method comprises: acquiring the temperature difference voltage signal through the first signal terminal; and inputting the temperature compensation signal at the first signal terminal.

BRIEF DESCRIPTION OF THE ACCOMPANYING DRAWINGS

Figure 1B:
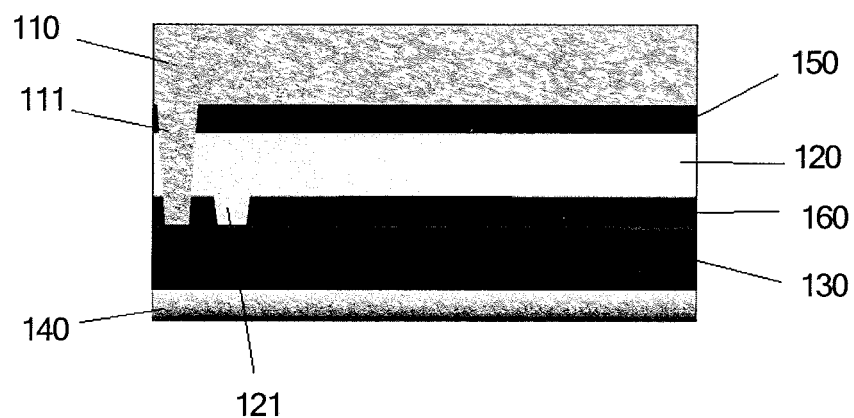
Figure 2:
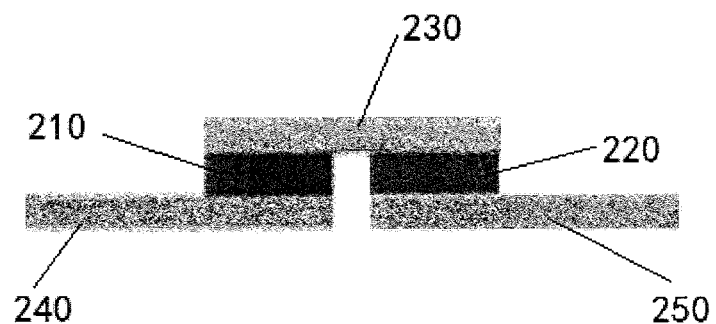
Figure 3:
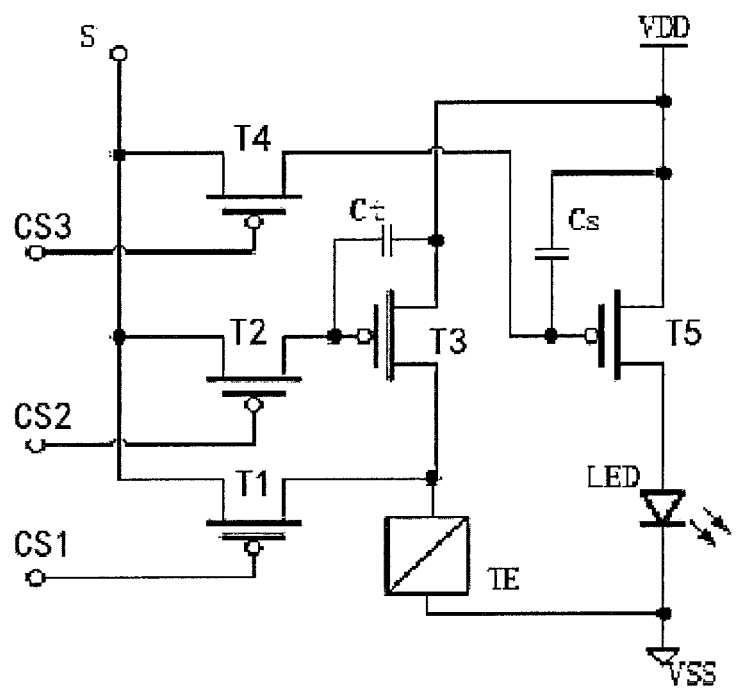
Figure 4A:
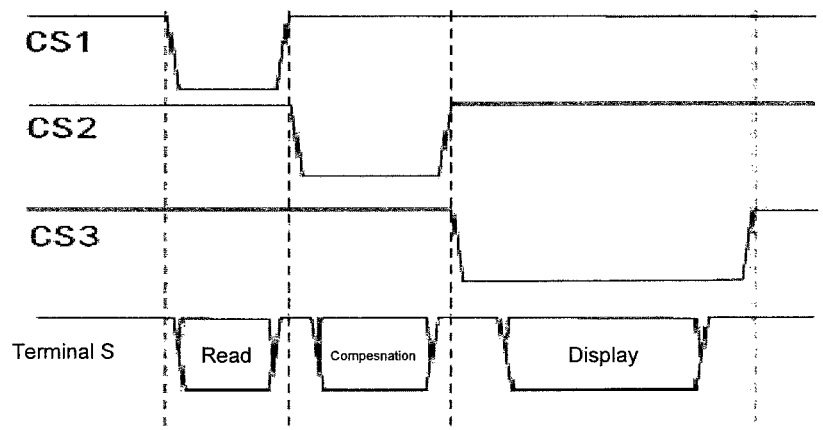
Figure 4B:
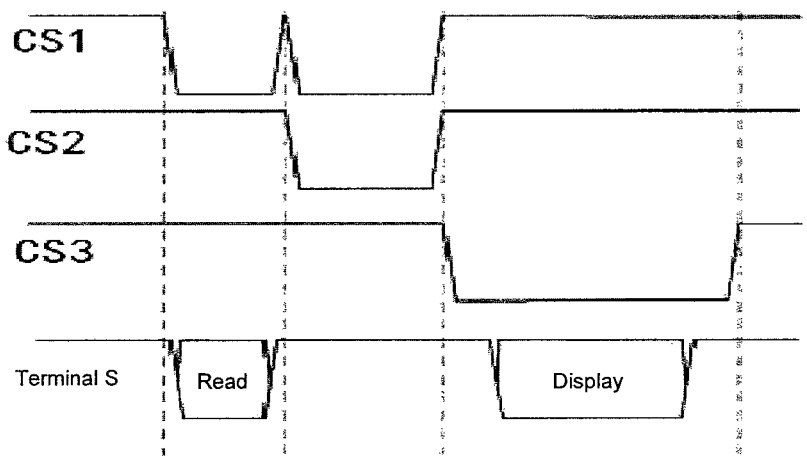

The accompanying drawings are included to provide a further understanding of the present disclosure. The accompanying drawings are incorporated in the present application and constitute a part of the present application. The accompanying drawings illustrate the embodiments of the present disclosure, and are used to explain the principles of the present disclosure together with the description. Obviously, the accompanying drawings below are only some of the embodiments of the present disclosure, and those of ordinary skill in the art may further obtain other accompanying drawings according to the accompanying drawings without any creative work. In the accompanying drawings:

FIG. 1A schematically illustrates a schematic structural diagram of a display panel according to an exemplary embodiment of the present disclosure;

FIG. 1B schematically illustrates a schematic sectional view of a pixel unit according to an exemplary embodiment of the present disclosure;

FIG. 2 schematically illustrates a schematic diagram of a thermoelectric element according to an exemplary embodiment of the present disclosure;

FIG. 3 schematically illustrates a schematic circuit diagram of a pixel circuit according to an exemplary embodiment of the present disclosure; and FIGS. 4A and 4B are timing diagrams of performing temperature compensation on a light emitting element according to an exemplary embodiment of the present disclosure.

DETAILED DESCRIPTION

Exemplary embodiments of the present disclosure will now be described more comprehensively with reference to the accompanying drawings. However, the embodiments may be embodied in a variety of forms and should not be construed as being limited to examples set forth herein; rather, these embodiments are provided so that the present disclosure will be more comprehensive and complete, to convey the concept of the present disclosure to those skilled in the art more comprehensively. The described features, structures, or characteristics may be combined in any suitable manner in one or more embodiments.

It will also be understood that when terms "comprising" and/or "including" are used in the specification, it indicates the presence of the features, integers, steps, operations, elements, and/or components, but does not exclude the presence or addition of one or more other features, integers, steps, operations, elements, components and/or their groups.

The embodiments of the present disclosure provide a display panel having provided thereon a plurality of thermoelectric elements, which are configured to read temperature difference voltage signals related to temperatures of a plurality of light emitting elements and perform temperature compensation on the plurality of light emitting elements according to the temperature compensation signals related to the temperature difference voltage signals. The plurality of thermoelectric elements are provided to perform temperature compensation on the plurality of light emitting elements of the display panel, which may cause the temperatures of the plurality of light emitting elements to tend to be consistent, thereby improving display quality.

A display panel according to an exemplary embodiment of the present disclosure will be described in detail below with reference to FIGS. 1A and 1B.

FIG. 1A schematically illustrates a schematic structural diagram of a display panel according to an exemplary embodiment of the present disclosure.

As shown in FIG. 1A, the display panel 10 according to the exemplary embodiment of the present disclosure may comprise a plurality of pixel units 100.

FIG. 1B schematically illustrates a schematic sectional view of a pixel unit 100 according to an exemplary embodiment of the present disclosure. As shown in FIG. 1B, at least one (for example, each) of the plurality of pixel units 100 may comprise a substrate 140, a thermoelectric conversion layer 120 disposed on the substrate 140, and a display layer 110.

The display layer 110 may comprise light emitting elements such as OLED light emitting elements or QLED light emitting elements. The light emitting elements emit light with different intensities to display an image according to output current for driving thin film transistors.

The thermoelectric conversion layer 120 comprises a plurality of thermoelectric elements which may perform thermoelectric conversion. Each of the thermoelectric elements is configured to generate a voltage signal related to a temperature of a corresponding one of the light emitting elements, and perform temperature compensation on the light emitting element, so that the temperatures of light emitting elements in the respective pixel units tend to be consistent.

For example, the thermoelectric element has a first terminal and a second terminal, wherein the first terminal is disposed adjacent to the light emitting element and in thermal contact with the light emitting element, and the second terminal is disposed away from the light emitting element.

The thermoelectric element further has a first signal terminal and a second signal terminal. The thermoelectric element is configured to generate a temperature difference voltage signal between the first signal terminal and the second signal terminal according to a temperature difference between the first terminal and the second terminal.

The thermoelectric element is further configured to receive a temperature compensation signal through the first signal terminal to perform temperature compensation on the light emitting element through thermal contact between the first terminal of the thermoelectric element and the light emitting element.

According to an exemplary embodiment of the present disclosure, the thermoelectric element may perform temperature compensation on the light emitting element according to the temperature compensation signal related to the temperature difference voltage signal. Here, the temperature compensation signal being related to the temperature difference voltage signal may refer to the temperature compensation signal being obtained or set based on the temperature difference voltage signal. For example, as described below with reference to an exemplary embodiment of the present disclosure, the temperature compensation signal may be obtained according to a difference between an average value of a plurality of temperature difference voltage signals generated by the plurality of thermoelectric elements and each temperature difference voltage signal, or may be a temperature difference voltage signal generated by a thermoelectric element.

Since the first terminal is disposed adjacent to the light emitting element and is in thermal contact with the light emitting element, a temperature at the first terminal of the thermoelectric element is the same as or substantially the same as that of the light emitting element. Therefore, the temperature difference voltage signal may be considered to be generated by the thermoelectric element according to a temperature difference between the light emitting element and the second terminal of the thermoelectric element. That is, the temperature difference voltage signal generated by the thermoelectric element is related to the temperature of the light emitting element.

In addition, the second terminal of the thermoelectric element is disposed away from the light emitting element, and a temperature at the second terminal is less affected by the temperature of the light emitting element. Therefore, temperatures at second terminals of the respective thermoelectric elements may be considered to be substantially the same, and thus may be used as a reference temperature. In this case, since the respective thermoelectric elements have the same reference temperature, the respective temperature difference voltage signals generated by all the respective thermoelectric elements may be associated with each other through the reference temperature.

As described above, the thermoelectric elements in the plurality of pixel units read the temperature difference voltage signals related to the temperatures of the respective light emitting elements respectively, and perform temperature compensation on the plurality of light emitting elements according to, for example, the temperature compensation signals related to the temperature difference voltage signals. In this way, the temperatures of the respective light emitting elements may tend to be consistent when the display panel is used for display, thereby improving the display quality of the display panel.

According to an exemplary embodiment of the present disclosure, since the plurality of pixel units each have a thermoelectric element, the accuracy of temperature compensation on the display panel may be improved, which is advantageous for enabling the temperatures of the respective pixels of the display panel to tend to be consistent.

An example of a thermoelectric element according to an exemplary embodiment of the present disclosure will be described below with reference to FIG. 2.

FIG. 2 schematically illustrates a schematic diagram of a thermoelectric element according to an exemplary embodiment of the present disclosure.

As shown in FIG. 2, the thermoelectric element according to the exemplary embodiment of the present disclosure may comprise a first semiconductor layer 210, a second semiconductor layer 220, a coupling electrode 230, a first electrode 240, and a second electrode 250.

The first semiconductor layer 210 has a first conductivity type, the second semiconductor layer 220 has a second conductivity type different from the first conductivity type, and the first semiconductor layer 210 is disposed separately from the second semiconductor layer 220. For example, the first semiconductor layer 210 and the second semiconductor layer 220 may be provided in the same layer and disposed separately from each other. As another example, the first semiconductor layer 210 may be an N-type semiconductor layer, and the second semiconductor layer 220 may be a P-type semiconductor layer.

The coupling electrode 230 is provided at the first terminal and electrically couples the first semiconductor layer 210 and the second semiconductor layer 220. For example, a lower surface of the coupling electrode 230 is in contact with upper surfaces of the first semiconductor layer 210 and the second semiconductor layer 220 to electrically connect the first semiconductor layer 210 and the second semiconductor layer 220. Here, the coupling electrode 230 forms the first terminal of the thermoelectric element which is disposed adjacent to the light emitting element. A material of the coupling electrode 230 is not specifically limited in the present disclosure, as long as the coupling electrode 230 may realize electrical coupling between the first semiconductor layer 210 and the second semiconductor layer 220.

An upper surface of the coupling electrode 230 is disposed adjacent to the light emitting element, and thus a temperature of the coupling electrode 230 is substantially the same as or the same as that of the light emitting element.

According to an exemplary embodiment of the present disclosure, the coupling electrode 230 may be used as one electrode of the light emitting element, that is, the thermoelectric element and the light emitting element share the coupling electrode 230. In this case, the temperature of the coupling electrode 230 is the temperature of the light emitting element.

In addition, according to an exemplary embodiment of the present disclosure, the coupling electrode 230 may be in direct contact with the light emitting element. In this case, the temperature of the coupling electrode 230 may be considered to be the same as that of the light emitting element.

According to an exemplary embodiment of the present disclosure, the coupling electrode 230 may be disposed separately from the light emitting element. In this case, as long as effective heat transfer may be achieved between the coupling electrode 230 and the light emitting element, the temperature of the coupling electrode 230 may be substantially the same as that of the light emitting element. For example, as shown in FIG. 1B, according to an exemplary embodiment of the present disclosure, a first insulating layer 150 capable of achieving effective heat transfer may be disposed between the display layer 110 and the thermoelectric conversion layer 120, so that the coupling electrode 230 is disposed separately from the light emitting element.

The first electrode 240 is provided at the second terminal and is coupled to the first semiconductor layer 210, and the second electrode 250 is provided at the second terminal and is coupled to the second semiconductor layer 220. Here, the first electrode 240 and the second electrode 250 together constitute the second terminal of the thermoelectric element.

In some embodiments, the first signal terminal is disposed on the first electrode, and the second signal terminal is disposed on the second electrode.

For the thermoelectric element as shown in FIG. 2, in a case where the first semiconductor layer 210 and the second semiconductor layer 220 are an N-type semiconductor layer and a P-type semiconductor layer respectively, if a positive voltage and a negative voltage are applied to the first electrode 240 and the second electrode 250 through the first signal terminal and the second signal terminal respectively, both electrons in the N-type semiconductor layer and holes in the P-type semiconductor layer flow toward the second terminal of the thermoelectric element, so that the temperature at the first terminal of the thermoelectric element decreases and the temperature at the second terminal of the thermoelectric element increases, which may realize heating of the light emitting element. If a negative voltage and a positive voltage are applied to the first electrode 240 and the second electrode 250 through the first signal terminal and the second signal terminal respectively, both electrons in the N-type semiconductor layer and holes in the P-type semiconductor layer flow toward the first terminal of the thermoelectric element, so that the temperature at the first terminal of the thermoelectric element increases and the temperature at the second terminal of the thermoelectric element decreases, which may realize cooling of the light emitting element.

In addition, if there is a temperature difference between the first terminal and the second terminal, a voltage is generated between the first electrode 240 and the second electrode 250 (i.e., the first signal terminal and the second signal terminal). Herein, this voltage is referred to as a temperature difference voltage. Therefore, the thermoelectric element may acquire the temperature difference voltage signal related to the temperature of the light emitting element according to this feature.

Here, a relationship between the temperature difference between the first terminal and the second terminal and the voltage between the first electrode 240 and the second electrode 250 may be expressed by the following equation:

temperature difference=temperature difference voltage/Seebeck coefficient

Therefore, according to the display panel of the exemplary embodiment of the present disclosure, a voltage signal related to a temperature of each of the respective light emitting elements may be generated using the thermoelectric element as shown in FIG. 2, and temperature compensation may be performed on the light emitting element using the thermoelectric element.

For example, the temperature difference voltage signal related to the temperature of the light emitting element between the first electrode 240 and the second electrode 250 may be acquired, and a temperature compensation signal related to the temperature difference voltage signal is applied between the first electrode 240 and the second electrode 250 to perform temperature compensation on the light emitting element, so that the temperatures of the respective light emitting elements tend to be consistent, which will be described in detail below with reference to exemplary embodiments of the present disclosure.

According to an exemplary embodiment of the present disclosure, the thermoelectric elements of the plurality of pixel units may share the second electrode 250. The shared second electrode 250 may be coupled (through, for example, a second signal terminal thereon) to a specific voltage to be used as a reference terminal at which a temperature difference voltage signal is obtained or a temperature compensation signal is applied, for example, the shared second electrode 250 may be coupled to a common voltage source or the ground. In this case, the temperature difference voltage signal may be obtained through the first signal terminal on the first electrode 240, and the temperature compensation signal may be applied to the first electrode 240 through the first signal terminal.

According to an exemplary embodiment of the present disclosure, the display panel may further comprise a heat equalizing element disposed at the second terminal of the thermoelectric element, so that the temperatures at the second terminals of the thermoelectric elements of the respective pixel units are consistent. For example, a graphite sticker, a metal foil (for example, a copper foil), etc. may be used as the heat equalizing element.

With continued reference to FIG. 1B, according to an exemplary embodiment of the present disclosure, the display panel may further comprise a driving circuit layer 130. In some embodiments, the driving circuit layer 130 may be disposed between the thermoelectric conversion layer 120 and the display layer 110, and may be electrically coupled to the light emitting elements in the display layer 110 and the thermoelectric elements in the thermoelectric conversion layer 120. There are circuit elements disposed in the driving circuit layer 130, and these circuit elements may constitute a pixel circuit together with the light emitting elements and the thermoelectric elements, to realize driving of the light emitting elements and the thermoelectric elements.

According to an exemplary embodiment of the present disclosure, the driving circuit layer 130 may comprise a temperature difference reading sub-circuit and a temperature compensation sub-circuit for controlling each of the thermoelectric elements. The temperature difference reading sub-circuit is electrically coupled to the first signal terminal of the thermoelectric element and is configured to read the temperature difference voltage signal from the first signal terminal of the thermoelectric element. The temperature compensation sub-circuit is electrically coupled to the first signal terminal of the thermoelectric element and is configured to input the temperature compensation signal to the first signal terminal of the thermoelectric element. Both the temperature reading sub-circuit and the temperature compensation sub-circuit may be composed of circuit elements such as thin film transistors or capacitors.

According to an exemplary embodiment of the present disclosure, the second insulating layer 160 may be disposed between the thermoelectric conversion layer 120 and the driving circuit layer 130 to insulate them from each other. In addition, the display layer 110 and the thermoelectric conversion layer 120 may be electrically coupled to the driving circuit layer 130 respectively via through holes, such as the through holes 111 and 121 as shown in FIG. 1B.

An example of a pixel circuit comprising circuit elements in the driving circuit layer 130 as well as the light emitting elements and the thermoelectric elements will be described below with reference to an exemplary embodiment of the present disclosure and FIG. 3.

FIG. 3 schematically illustrates a circuit diagram of a pixel circuit according to an exemplary embodiment of the present disclosure.

The pixel circuit may comprise a light emitting element LED, a driving sub-circuit, a thermoelectric element TE, a temperature difference reading sub-circuit, and a temperature compensation sub-circuit.

In the embodiment shown in FIG. 3, the light emitting element LED has a first terminal and a second terminal. The first terminal is configured to receive driving current, and the second terminal is electrically coupled to a second voltage terminal VSS.

The thermoelectric element TE has a first signal terminal and a second signal terminal. The second signal terminal is electrically coupled to the second voltage terminal VSS.

The temperature difference reading sub-circuit is electrically coupled to a first control signal terminal CS1, a read signal terminal (a signal terminal S in FIG. 3) and the first signal terminal of the thermoelectric element TE, and is configured to read a temperature difference voltage signal at the first signal terminal of the thermoelectric element TE to the read signal terminal under control of a first control signal from the first control signal terminal CS1. It should be illustrated that in the embodiment of FIG. 3, the read signal terminal and the following compensation signal terminal and data signal terminal are all implemented by the signal terminal S, but this is only by way of example, and in other embodiments, the read signal terminal, the compensation signal terminal and the data signal terminal may be implemented as different signal terminals.

As shown in FIG. 3, the temperature difference reading sub-circuit may comprise a first transistor T1. The first transistor T1 has a control terminal electrically coupled to the first control signal terminal CS1, a first terminal electrically coupled to the first signal terminal of the thermoelectric element TE, and a second terminal electrically coupled to the read signal terminal. Although it is shown in FIG. 3 that the temperature reading sub-circuit comprises only the first transistor T1, it should be understood that the present disclosure is not limited thereto.

For example, the gate of the first transistor T1 is electrically coupled to the first control signal terminal CS1 to be turned on or turned off in response to a first control signal. The first terminal of the first transistor T1 is configured to output the temperature difference voltage signal of the thermoelectric element TE. The second terminal of the first transistor T1 is electrically coupled to the thermoelectric element TE. In a case where the second electrode 250 of the thermoelectric element TE is electrically coupled to a common voltage source VSS (for example, the ground), the second terminal of the first transistor T1 may be electrically coupled to the first electrode 240 of the thermoelectric element TE.

The temperature compensation sub-circuit is electrically coupled to a second control signal terminal CS2, a compensation signal terminal (i.e., the signal terminal S) and the first signal terminal of the thermoelectric element TE, and is configured to transmit the temperature compensation signal from the compensation signal terminal to the first signal terminal of the thermoelectric element TE under control of a second control signal from the second control signal terminal CS2.

As shown in FIG. 3, the temperature compensation sub-circuit may comprise a second transistor T2, a third transistor T3, and a compensation capacitor Ct. The second transistor T2 has a control terminal electrically coupled to the second control signal terminal CS2, a first terminal electrically coupled to the compensation signal terminal, and a second terminal electrically coupled to a control terminal of the third transistor T3. The third transistor T3 has a first terminal electrically coupled to a first voltage terminal VDD, and a second terminal electrically coupled to the first signal terminal of the thermoelectric element TE. The compensation capacitor Ct has a first terminal electrically coupled to the control terminal of the third transistor T3, and a second terminal electrically coupled to the first voltage terminal VDD. Although it is shown in FIG. 3 that the temperature compensation sub-circuit comprises only the second transistor T2, the third transistor T3, and the compensation capacitor Ct, it should be understood that the present disclosure is not limited thereto.

For example, the gate of the second transistor T2 is electrically coupled to the second control signal terminal CS2 to be turned on or turned off in response to the second control signal, the first terminal of the second transistor T2 receives the temperature compensation signal, and the second terminal of the second transistor T2 is electrically coupled to the gate of the third transistor T3 and the first terminal of the compensation capacitor Ct. The first terminal of the third transistor T3 is electrically coupled to the power supply voltage VDD of the display panel, and the second terminal of the third transistor T3 is electrically coupled to the thermoelectric element TE, for example, may be electrically coupled to the unshared first electrode 240 of the thermoelectric element TE. The second terminal of the capacitor Ct is electrically coupled to the second terminal of the third transistor T3.

According to an exemplary embodiment of the present disclosure, in a case where the internal temperature compensation method is performed using the circuit as described below, the first terminal of the second transistor T2 may be electrically coupled to the first terminal of the first transistor T1 to receive the temperature difference voltage signal from the first terminal of the first transistor T1 as the temperature compensation signal.

The driving sub-circuit is electrically coupled to the first voltage terminal VDD and the first terminal of the light emitting element LED and is configured to generate driving current for driving the light emitting element LED to emit light based on a first voltage from the first voltage terminal VDD. For example, in FIG. 3, the driving sub-circuit may comprise a fourth transistor T4, a fifth transistor T5, and a storage capacitor Cs.

For example, the fourth transistor T4 has a gate coupled to a third control signal terminal CS3 (for example, a scanning signal terminal of the display panel) to be turned on or turned off, a first terminal electrically coupled to a data signal terminal (for example, the signal terminal S) to receive, for example, a display data signal, and a second terminal electrically coupled to a control electrode of the fifth transistor T5. The fifth transistor T5 has a first terminal electrically coupled to the first voltage terminal VDD, and a second terminal electrically coupled to the first terminal of the light emitting element LED. The storage capacitor Cs has a first terminal electrically coupled to the control electrode of the fifth transistor T5, and a second terminal electrically coupled to the first terminal of the fifth transistor T5.

According to an exemplary embodiment of the present disclosure, for example, the transistors T1-T5 may be P-type transistors, the control terminals of the transistors T1-T5 may be gates, the first terminals of the transistors T1-T5 may be sources, and the second terminals of the transistors T1-T5 may be drains. However, as will be appreciated by those skilled in the art, the transistors T1-T5 are not limited to P-type transistors, for example, they may also be N-type transistors.

In addition, although not shown in the accompanying drawings, according to an exemplary embodiment of the present disclosure, an amplifier may be disposed in the temperature compensation sub-circuit to amplify a temperature compensation signal to expand a temperature compensation range.

A method for performing temperature compensation on a light emitting element using the circuit shown in FIG. 3 according to an exemplary embodiment of the present disclosure will be described below with reference to FIGS. 4A and 4B. Here, FIG. 4A is a timing diagram of an exemplary method for performing temperature compensation on a light emitting element according to an exemplary embodiment of the present disclosure; and FIG. 4B is a timing diagram of another exemplary method for performing temperature compensation on a light emitting element according to an exemplary embodiment of the present disclosure.

One example of temperature compensation on a light emitting element according to an exemplary embodiment of the present disclosure will be described below with reference to FIGS. 3 and 4A.

Firstly, a temperature difference voltage signal related to each of the light emitting elements is read.

The first control signal terminal CS1 is maintained at a low level, and the second control signal terminal CS2 and the third control signal terminal CS3 are maintained at a high level. At this time, the transistor T1 is turned on, the transistors T2-T5 are turned off, and the light emitting element does not operate. The transistor T1 outputs a temperature difference voltage signal generated by the thermoelectric element TE to a back-end circuit (for example, a controller of a display apparatus) through the signal terminal S. The back-end circuit determines whether unevenness of the acquired temperature difference voltage signals of the respective light emitting elements of the display panel exceeds a threshold value (by, for example, 5%), and if the unevenness exceeds the threshold value, temperature compensation is performed on the respective light emitting elements using the following steps.

Temperature compensation is then performed on the light emitting elements.

The second control signal terminal CS2 is at a low level, and the first control signal terminal CS1 and the third control signal terminal CS3 are at a high level. At this time, the transistors T2 and T3 are turned on, the transistors T1, T4, and T5 are turned off, and the light emitting element does not operate. A temperature compensation signal from the outside of the display panel, which is received from the signal terminal S, is written to the compensation capacitor Ct through the transistor T2, and the thermoelectric element TE is driven by the transistor T3 to perform temperature compensation on the light emitting element. Here, the temperature compensation signal may be a difference between a temperature difference voltage of the light emitting element and an average temperature difference voltage of the respective light emitting elements in the display panel. A relationship between the difference and the temperature of the light emitting element is expressed by the following equation.

$$V_{compensation} = (T_{LED} - T_{average}) * \text{Seebeck coefficient}$$

wherein $V_{compensation}$ is the difference between the temperature difference voltage of the light emitting element and the average temperature difference voltage of the respective light emitting elements, that is, the temperature compensation signal, $T_{LED}$ is the temperature of the light emitting element, and $T_{average}$ is the average temperature of the respective light emitting elements. It may be seen from the above equation that after each of the light emitting elements is compensated using the voltage signal described above, the temperatures of the respective light emitting elements may be close to the average temperature of the respective light emitting elements, so that the temperatures of the respective light emitting elements tend to be consistent.

Next, the light emitting elements are driven to display an image. In this period, the first control signal terminal CS1 and the second control signal terminal CS2 are at a high level, and the third control signal terminal CS3 is at a low level. At this time, the transistors T1-T3 are turned off, the transistors T4 and T5 are turned on, and the thermoelectric element TE does not operate. The display data signal is written by the signal terminal S to the storage capacitor Cs through the transistor T4, to drive the light emitting element through the transistor T5 to emit light.

In the temperature compensation method, a temperature compensation signal related to the temperature difference voltage signal is received from the outside of the display panel, and thus the temperature compensation method may be referred to herein as an external temperature compensation method.

In the external temperature compensation method, the temperature compensation signal is received from the outside of the display panel, and thus the external temperature compensation method is suitable for a case where there is a large temperature difference between the respective light emitting elements. For example, when unevenness of the acquired temperature difference voltage signals of the respective light emitting elements of the display panel exceeds a threshold value (by, for example, 5%), temperature compensation may be performed on the respective light emitting elements using the external temperature compensation method.

Another example of temperature compensation on a light emitting element according to an exemplary embodiment of the present disclosure will be described below with reference to FIGS. 3 and 4B.

Firstly, a temperature difference voltage signal related to each of the light emitting elements is acquired.

The first control signal terminal CS1 is maintained at a low level, and the second control signal terminal CS2 and the third control signal terminal CS3 are maintained at a high level. At this time, the transistor T1 is turned on, the transistors T2-T5 are turned off, and the light emitting element does not operate. The transistor T1 outputs a temperature difference voltage signal generated by the thermoelectric element TE to a back-end circuit (for example, a controller of a display apparatus) through the signal terminal S. The back-end circuit determines whether unevenness of the acquired temperature difference voltage signals of the respective light emitting elements of the display panel does not exceed a threshold value (by, for example, 5%), and if the unevenness does not exceed the threshold value, temperature compensation is performed on the respective light emitting elements using the following steps.

Temperature compensation is then performed on the light emitting elements.

The first control signal terminal CS1 and the second control signal terminal CS2 are maintained at a low level, and the third control signal terminal CS3 is maintained at a high level. At this time, the transistors T1 and T3 are turned on, the transistors T4 and T5 are turned off, and the light emitting element does not operate. A temperature difference voltage signal related to a light emitting element, which is generated by the thermoelectric element TE, is written as a temperature compensation signal to the compensation capacitor Ct through the transistors T1 and T2, and the thermoelectric element TE is driven by the transistor T3 to perform temperature compensation on the light emitting element. A relationship between the compensation voltage and the temperature of the light emitting element is expressed by the following equation.

$$V_{compensation} = (T_{LED} - T_{second\ terminal}) * \text{Seebeck coefficient}$$

wherein $V_{compensation}$ is the temperature difference voltage generated by the thermoelectric element TE as the temperature compensation signal, $T_{LED}$ is the temperature of the light emitting element, and $T_{second\ terminal}$ is a temperature at the second terminal of the thermoelectric element TE. It may be seen from the above equation that after temperature compensation is performed on each of the light emitting elements using the voltage signal described above, the temperatures of the respective light emitting elements may be close to the temperatures at the second terminals of the respective thermoelectric element TEs. As described above, since the second terminals of the respective thermoelectric element TEs are away from the light emitting elements which generate heat, the temperatures at the second terminals of the respective thermoelectric element TEs are substantially the same, and therefore the temperatures of the respective light emitting elements on which temperature compensation has been performed tend to be consistent.

Finally, the light emitting elements are driven to display an image. The first control signal terminal CS1 and the second control signal terminal CS2 are maintained at a high level, and the third control signal terminal CS3 is maintained at a low level. At this time, the transistors T1-T3 are turned off, the transistors T4 and T5 are turned on, and the thermoelectric element TE does not operate. The display data signal is written by the signal terminal S to the storage capacitor Cs through the transistor T4, to drive the light emitting element through the transistor T5 to emit light.

In the temperature compensation method, a temperature compensation signal is generated by a thermoelectric element TE, that is, the compensation signal is internally generated in the temperature compensation circuit, and thus the temperature compensation method may be referred to herein as an internal temperature compensation method.

In the temperature compensation method, since the temperature difference voltage signal generated by the thermoelectric element TE is used as the temperature compensation signal, the temperature compensation method is suitable for a case where there is a small temperature difference between the respective light emitting elements, i.e., a case where a small compensation voltage needs to be applied. For example, when unevenness of the acquired temperature difference voltage signals of the respective light emitting elements of the display panel does not exceed a threshold value (by, for example, 5%), temperature compensation may be performed on the respective light emitting elements using the internal temperature compensation method.

According to an exemplary embodiment of the present disclosure, the external temperature compensation method and the internal temperature compensation method described above may be applied when the light emitting elements do not emit light, for example, temperature compensation may be performed on the light emitting elements between frames using the above methods.

In addition, according to an exemplary embodiment of the present disclosure, the external temperature compensation method and the internal temperature compensation method may be used alone or in combination. When the external temperature compensation method and the internal temperature compensation method are used in combination, since a compensation range of the external temperature compensation method is large and a compensation range of the internal temperature compensation method is small, the external temperature compensation method may be applied at a large time interval, and the internal temperature compensation method may be applied at a small time interval. For example, the external temperature compensation method is applied every half hour or one hour or more, and the internal temperature compensation method is applied every 20 minutes or 15 minutes or less (for example, every several frames).

The embodiments of the present disclosure provide a display apparatus comprising the display panel according to any of the above embodiments. The display apparatus may comprise an OLED display apparatus and a QLED display apparatus.

Further, the embodiments of the present disclosure provide a method for performing temperature compensation on the display panel described above. The method comprises: acquiring the temperature difference voltage signal through the first signal terminal; and inputting the temperature compensation signal at the first signal terminal.

With reference to the above description of the external temperature compensation method, according to the embodiments of the present disclosure, performing temperature compensation on the light emitting element through the thermoelectric element may comprise: acquiring a temperature compensation signal according to a difference between an average value of a plurality of temperature difference voltage signals of the plurality of thermoelectric elements and a temperature difference voltage signal of each thermoelectric element; and performing temperature compensation on the light emitting element according to the temperature compensation signal through the thermoelectric element.

With reference to the above description of the internal temperature compensation method, according to the embodiments of the present disclosure, performing temperature compensation on the light emitting element through the thermoelectric element may comprise: performing temperature compensation on the light emitting element according to the temperature compensation signal through the thermoelectric element, wherein a temperature difference voltage signal of the thermoelectric element is used as the temperature compensation signal.

As described above, in the pixel circuit, the display panel, and the temperature compensation method for the display panel according to the exemplary embodiments of the present disclosure, a temperature difference voltage signal related to a temperature of a light emitting element is read through a thermoelectric element, and temperature compensation is performed on the light emitting element according to the temperature compensation signal related to the temperature difference voltage signal, so that the temperatures of the respective light emitting elements may tend to be consistent when the display panel is used for display, thereby improving the display quality of the display apparatus.

The above description of the specific exemplary embodiments of the present disclosure has been presented with reference to the accompanying drawings. These exemplary embodiments are not intended to be exhaustive or to limit the present disclosure to a precise form disclosed. It is obvious that many modifications and changes may be made by those of ordinary skill in the art under inspiration of the above teachings. Therefore, the scope of the present disclosure is not intended to be limited to the above embodiments, but is intended to be defined by the claims and their equivalents.

We claim:

1. A display panel comprising a plurality of pixel units, wherein at least one of the plurality of pixel units comprises:
    a display layer comprising a light emitting element;
    a thermoelectric conversion layer comprising a thermoelectric element having a first terminal and a second terminal, wherein the first terminal is disposed adjacent to the light emitting element and in thermal contact with the light emitting element, and the second terminal is disposed away from the light emitting element; and
    a driving circuit layer electrically coupled to the light emitting element and the thermoelectric element, and located on a side of the thermoelectric conversion layer away from the display layer, wherein the driving circuit layer is configured to drive the light emitting element and the thermoelectric element,
    wherein the thermoelectric element has a first signal terminal and a second signal terminal provided at the second terminal of the thermoelectric element, and the thermoelectric element is configured to generate a temperature difference voltage signal between the first signal terminal and the second signal terminal according to a temperature difference between the first terminal and the second terminal.

2. The display panel according to claim 1, wherein the thermoelectric element is further configured to receive a temperature compensation signal through the first signal terminal to perform temperature compensation on the light emitting element through thermal contact between the first terminal of the thermoelectric element and the light emitting element.

3. A method for performing temperature compensation on the display panel according to claim 2, comprising:
    acquiring the temperature difference voltage signal through the first signal terminal; and
    inputting the temperature compensation signal at the first signal terminal.

4. The display panel according to claim 2, wherein the thermoelectric element comprises:
    a first semiconductor layer having a first conductivity type;
    a second semiconductor layer having a second conductivity type different from the first conductivity type, wherein the second semiconductor layer is disposed separately from the first semiconductor layer;
    a coupling electrode provided at the first terminal of the thermoelectric element and electrically coupling the first semiconductor layer and the second semiconductor layer;
    a first electrode provided at the second terminal of the thermoelectric element and electrically coupled to the first semiconductor layer; and
    a second electrode provided at the second terminal of the thermoelectric element and electrically coupled to the second semiconductor layer,
    wherein the first signal terminal is disposed on the first electrode, and the second signal terminal is disposed on the second electrode.

5. The display panel according to claim 2, further comprising:
    a heat equalizing element disposed at the second terminal of the thermoelectric element, so that second terminals of thermoelectric elements in the at least one pixel unit have consistent temperature.

6. The display panel according to claim 1, wherein the thermoelectric element comprises:
    a first semiconductor layer having a first conductivity type;
    a second semiconductor layer having a second conductivity type different from the first conductivity type, wherein the second semiconductor layer is disposed separately from the first semiconductor layer;
    a coupling electrode provided at the first terminal of the thermoelectric element and electrically coupling the first semiconductor layer and the second semiconductor layer;
    a first electrode provided at the second terminal of the thermoelectric element and electrically coupled to the first semiconductor layer; and
    a second electrode provided at the second terminal of the thermoelectric element and electrically coupled to the second semiconductor layer,
    wherein the first signal terminal is disposed on the first electrode, and the second signal terminal is disposed on the second electrode.

7. The display panel according to claim 6, wherein the second electrode is a common electrode.

8. The display panel according to claim 1, wherein the coupling electrode of the thermoelectric element is one electrode of the light emitting element.

9. The display panel according to claim 1, further comprising:
    a heat equalizing element disposed at the second terminal of the thermoelectric element, so that second terminals of thermoelectric elements in the at least one pixel unit have consistent temperature.

10. The display panel according to claim 5, wherein the driving circuit layer comprises:
    a temperature difference reading sub-circuit electrically coupled to the first signal terminal of the thermoelectric element and configured to read the temperature difference voltage signal from the first signal terminal of the thermoelectric element; and
    a temperature compensation sub-circuit electrically coupled to the first signal terminal of the thermoelectric element and configured to input the temperature compensation signal to the first signal terminal of the thermoelectric element.

11. The display panel according to claim 10, wherein the temperature compensation signal is determined based on the temperature difference voltage signal.

12. The display panel according to claim 10, wherein the temperature compensation signal is determined based on a difference between the temperature difference voltage signal and an average value of respective temperature difference voltage signals which are read in the at least one pixel unit.

13. A pixel circuit, comprising:
    a light emitting element;

a driving sub-circuit electrically coupled to a first voltage terminal and a first terminal of the light emitting element and configured to generate driving current for driving the light emitting element to emit light based on a first voltage from the first voltage terminal;

a thermoelectric element having a first terminal and a second terminal, wherein the first terminal is disposed adjacent to the light emitting element and in thermal contact with the light emitting element, and the second terminal is disposed away from the light emitting element, and the thermoelectric element has a first signal terminal and a second signal terminal provided at the second terminal of the thermoelectric element, and the thermoelectric element is configured to generate a temperature difference voltage signal between the first signal terminal and the second signal terminal according to a temperature difference between the first terminal and the second terminal, and the second signal terminal is electrically coupled to a second voltage terminal;

a temperature difference reading sub-circuit electrically coupled to a first control signal terminal, a read signal terminal, and the first signal terminal of the thermoelectric element, and configured to read a temperature difference voltage signal at the first signal terminal of the thermoelectric element to the read signal terminal under control of a first control signal from the first control signal terminal; and a temperature compensation sub-circuit electrically coupled to a second control signal terminal, a compensation signal terminal, and the first signal terminal of the thermoelectric element, and configured to transmit a temperature compensation signal from the compensation signal terminal to the first signal terminal of the thermoelectric element under control of a second control signal from the second control signal terminal, wherein the driving sub-circuit, the temperature difference reading sub-circuit and the temperature compensation sub-circuit are located in a driving circuit layer and on a side of the thermoelectric element away from the light emitting element.

14. The pixel circuit according to claim 13, wherein the temperature difference reading sub-circuit comprises a first transistor, wherein the first transistor has a control terminal electrically coupled to the first control signal terminal, a first terminal electrically coupled to the first signal terminal of the thermoelectric element, and a second terminal electrically coupled to the read signal terminal.

15. The pixel circuit according to claim 13, wherein the temperature compensation sub-circuit comprises a second transistor, a third transistor, and a compensation capacitor, wherein the second transistor has a control terminal electrically coupled to the second control signal terminal, a first terminal electrically coupled to the compensation signal terminal, and a second terminal electrically coupled to a control terminal of the third transistor, the third transistor has a first terminal electrically coupled to the first voltage terminal, and a second terminal electrically coupled to the first signal terminal of the thermoelectric element, and the compensation capacitor has a first terminal electrically coupled to the control terminal of the third transistor, and a second terminal electrically coupled to the first voltage terminal.

16. The pixel circuit according to claim 13, wherein the read signal terminal and the compensation signal terminal are the same signal terminal.

\* \* \* \* \*